(12) United States Patent
Zhang et al.

(10) Patent No.: US 8,273,675 B2
(45) Date of Patent: Sep. 25, 2012

(54) FERROELECTRIC CERAMIC MATERIAL

(75) Inventors: Zuyi Zhang, Yokohama (JP); Jumpei Hayashi, Yokohama (JP); Kenji Takashima, Saitama (JP); Tatsuo Furuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 12/567,708

(22) Filed: Sep. 25, 2009

(65) Prior Publication Data

US 2010/0081559 A1 Apr. 1, 2010

(30) Foreign Application Priority Data

Sep. 30, 2008 (JP) ................................ 2008-255081
Sep. 10, 2009 (JP) ................................ 2009-209542

(51) Int. Cl.
*C04B 35/468* (2006.01)

(52) U.S. Cl. ........................................................ 501/139

(58) Field of Classification Search .................. 501/137, 501/139
See application file for complete search history.

(56) References Cited

U.S. PATENT DOCUMENTS

| | | |
|---|---|---|
| 4,530,031 A | 7/1985 | Donohue |
| 2009/0011923 A1 | 1/2009 | Hasegawa et al. |
| 2009/0042077 A1 | 2/2009 | Kobayashi et al. |

FOREIGN PATENT DOCUMENTS

| | | |
|---|---|---|
| JP | 2-225371 A | 9/1990 |
| JP | 3-45559 A | 2/1991 |
| JP | 2007-290940 A | 11/2007 |

OTHER PUBLICATIONS

Vittayakorn, Naratip, Dielectric Properties of Bismuth Dpoed Barium Titanate (BaTiO3) Ceramics, 2006, Journal of Applied Sciences Research, 2, pp. 1319-1322.*
Shi, Jing et al., Incorporation of Yttrium in Barium Titanate Ceramics, 1999, J. Am. Ceram. Soc., 82, pp. 1345-1348.*

* cited by examiner

*Primary Examiner* — Karl Group
(74) *Attorney, Agent, or Firm* — Fitzpatrick, Cella, Harper & Scinto

(57) ABSTRACT

Provided is a ferroelectric ceramic material containing $BaTiO_3$ as a main component which can control a Curie temperature in a wide range, has no phase transition in the vicinity of a room temperature, and exhibits excellent ferroelectric characteristics. The ferroelectric ceramic material includes an oxide represented by the formula: $(100-a-b)BaTiO_3 \cdot aBi_2O_3 \cdot bM_2O_3$, where M represents a trivalent metal other than Bi, and a and b satisfy $1 \leq a \leq 15$, $0 \leq b \leq 5$, and $5 \leq a+3b \leq 15$ and M is preferably a trivalent metal selected from fifth period transition metals or rare earth metals having an atomic number of 59 or higher to 69 or lower.

10 Claims, 1 Drawing Sheet

FERROELECTRIC CERAMIC MATERIAL

BACKGROUND OF THE INVENTION

1. Field of the Invention

The present invention relates to a ferroelectric ceramic material, in particular, a non-lead-based ferroelectric ceramic material of high performance capable of controlling a Curie temperature (Tc).

2. Description of the Related Art

Conventionally, as a ceramic material, a perovskite ($ABO_3$)-type oxide has been used as a ceramic capacitor material or a ceramic piezoelectric material. In particular, in a ferroelectric ceramic material, due to the emergence of a lead zirconate titanate (PZT), the PZT has become a mainstream of a piezoelectric ceramic material for a piezoelectric actuator of an inkjet head, a piezoelectric ultrasonic motor, and the like. A PZT ferroelectric material has also been used in FeRAM using its residual dielectric polarization. However, recently, lead has been considered to cause a problem as one of contaminants, and hence, there is an increasing demand for the development of a non-lead-based ferroelectric ceramic material containing no lead.

As the non-lead-based ferroelectric ceramic material, barium titanate ($BaTiO_3$) is well-known. $BaTiO_3$ is less expensive than a Nb-based material. However, due to the presence of transitions at room temperature (hereinafter, referred to as "Tr") from tetragonal to orthorhombic systems in the vicinity of 5° C., the ferroelectric properties of $BaTiO_3$ change in the vicinity of Tr, which makes it difficult to use $BaTiO_3$ in a number of applications. As a method of suppressing Tr of $BaTiO_3$, a method of replacing Ba with Ca is known. Further, although the Curie temperature of $BaTiO_3$ is in the vicinity of 125° C., when a solid solution is formed from $BaTiO_3$ and a number of perovskite-type oxides, the Curie temperature (Tc) tends to decrease rapidly, resulting in loss of ferroelectricity in the vicinity of a room temperature.

Further, it is also known that, when another metal oxide is added to $BaTiO_3$, the characteristics of $BaTiO_3$ change considerably. For example, Japanese Patent Application Laid-Open No. 2007-290940 discloses a dielectric ceramic capable of being calcined at a low temperature, in which CuO, MgO, ZnO, or $Bi_2O_3$ is added to $BaTiO_3$ in an amount of 4 to 10% by weight. Japanese Patent Application Laid-Open No. H03-45559 discloses a barium titanate ceramic exhibiting varistor nature, in which a rare earth oxide, a transition metal oxide, $Bi_2O_3$, and the like are added to $BaTiO_3$. Japanese Patent Application Laid-Open No. H02-225371 discloses a high-capacitance capacitor obtained by calcinating a layer of a dielectric composition formed of $BaTiO_3$, 8 to 0.5% by weight of a fluoride of Pb and Li, 4 to 0% by weight of an oxide of Bi, Zn, and Pb, and 8 to 1% by weight of an assistant. However, these ceramics are paraelectric and have low insulation property. An effective method of suppressing the phase transition of $BaTiO_3$ while keeping ferroelectricity has not been disclosed.

As described above, as a non-lead-based ferroelectric ceramic material, a ferroelectric ceramic material containing $BaTiO_3$ as a main component capable of preventing the decrease in the Curie temperature while suppressing the phase transition has not been known.

The present invention has been achieved in view of the above-mentioned background art, and an object thereof is to provide a ferroelectric ceramic material containing $BaTiO_3$ as a main component, capable of suppressing Tr of $BaTiO_3$ without decreasing the Curie temperature substantially.

SUMMARY OF THE INVENTION

A ferroelectric ceramic material, which solves the above-mentioned problems, includes an oxide represented by $(100-a-b)BaTiO_3.aBi_2O_3.bM_2O_3$, where M represents a trivalent metal other than Bi, and a and b satisfy $1 \leq a \leq 15$, $0 \leq b \leq 5$, and $5 \leq a+3b \leq 15$.

The present invention can provide a ferroelectric ceramic material containing $BaTiO_3$ as a main component, in which Bi and metal M (M is a trivalent metal other than Bi) are contained appropriately in $BaTiO_3$, whereby phase transition temperature (Tr) of $BaTiO_3$ is suppressed without decreasing the Curie temperature substantially. Further, the ferroelectric ceramic material according to the present invention has a low burden on the environment due to the absence of lead, which enables the clean applications of the material to a piezoelectric material, a ferroelectric memory, and the like.

Further features of the present invention will become apparent from the following description of exemplary embodiments with reference to the attached drawings.

DESCRIPTION OF THE EMBODIMENTS

Figure 1:
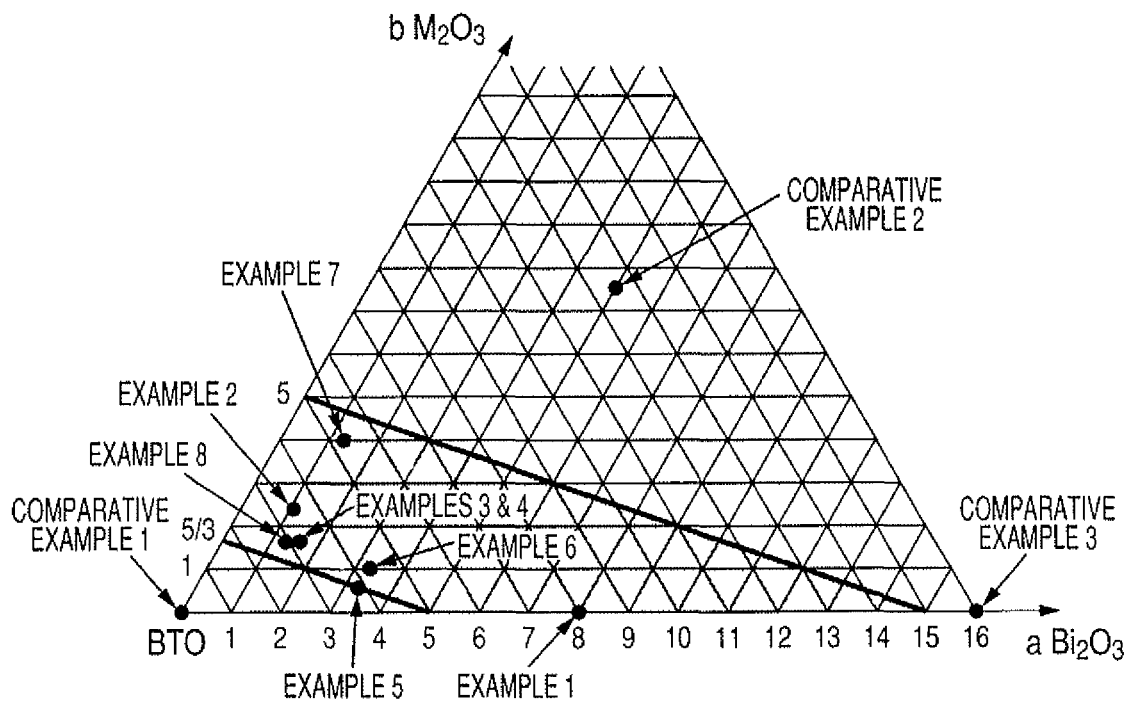
FIG. 1 is a schematic view illustrating a range of $BaTiO_3$, $Bi_2O_3$, and $M_2O_3$ components in the ferroelectric ceramic of the present invention.

Hereinafter, the present invention is described in detail.

The ferroelectric ceramic material according to the present invention is characterized by being formed of an oxide represented by $(100-a-b)BaTiO_3.aBi_2O_3.bM_2O_3$, where M represents a trivalent metal other than Bi, and a and b satisfy $1 \leq a \leq 15$, $0 \leq b \leq 5$, and $5 \leq a+3b \leq 15$.

More specifically, the ferroelectric ceramic material according to the present invention is formed of an oxide represented by two-component $(100-a)BaTiO_3.aBi_2O_3$ in the case where b is 0, and is formed of an oxide represented by three-component $(100-a-b)BaTiO_3.aBi_2O_3.bM_2O_3$ in the case where b is not 0.

The ferroelectric ceramic material of the present invention is formed of the following respective components: $BaTiO_3$, $Bi_2O_3$, and $M_2O_3$. The $BaTiO_3$ component contributes to the ferroelectricity, the $Bi_2O_3$ plays a role of enhancing its covalency, and the $M_2O_3$ is a component which is used to control the entire lattice constant, if required.

In the present invention, $Bi_2O_3+M_2O_3$ may not form a perovskite structure independently, and $Bi_2O_3+M_2O_3$ may form a solid solution in $BaTiO_3$ to be incorporated in a perovskite structure. $Bi^{3+}$ and $M^{3+}$ enter any site of an A site ($Ba^{2+}$) and a B site ($Ti^{4+}$) of $BaTiO_3$ perovskite.

A content a of $Bi_2O_3$ satisfies $1 \leq a \leq 15$, preferably $1.1 \leq a \leq 14.5$. When a of $Bi_2O_3$ is 1 or more to 15 or less, the covalency with respect to a framework of BaO crystal is enhanced, and the ferroelectricity derived from $BaTiO_3$ can be expressed highly. When a of $Bi_2O_3$ is less than 1, the covalency with respect to the framework of BaO crystal cannot function effectively. On the other hand, when the content a of $Bi_2O_3$ is larger than 15, the ferroelectricity derived from $BaTiO_3$ cannot be expressed highly, resulting in that the characteristics as the ferroelectric may be impaired. More preferably, a, b in $(100-a-b)BaTiO_3 \cdot aBi_2O_3 \cdot bM_2O_3$ is characterized by being formed of an oxide represented by $1.07 \leqq a \leqq 3.5$, $0.5 \leqq b \leqq 4$, and $5 \leqq a+3b \leqq 15$, whereby a ferroelectric material with even higher insulation property can be obtained. When a satisfies $1.07 \leqq a \leqq 3.5$, the specific resistance can be set to a value equal to or larger than that of $BaTiO_3$, and when b satisfies $1 \leqq b \leqq 2.4$, the Curie temperature Tc can be set to a value equal to or larger than that of $BaTiO_3$.

$M_2O_3$ is used, if required, and made of a trivalent metal other than Bi. When $M_2O_3$ is used in combination with the $Bi_2O_3$ component, a content b of $M_2O_3$ satisfies $0 \leqq b \leqq 5$, preferably $0.5 \leqq b \leqq 4$.

Further, when the contents of $Bi_2O_3$ and $M_2O_3$ are in a range of $5 \leqq a+3b \leqq 15$, both the effects of $Bi_2O_3$ and $M_2O_3$ can be realized.

M represents a trivalent metal other than Bi.

Specific examples of the M metal include Group III metal in a periodic table, trivalent transition metal, and rare earth trivalent metal. Preferably, a metal in the fifth period metal or rare earth trivalent metal is used, and specific examples thereof include In, Y, La, Ce, Pr, Nd, Pm, Sm, Eu, Gd, Dy, Ho, Er, Tm, and Yb. When a trivalent metal that can be matched with the lattice constant of $BaTiO_3$ is selected, and of those, the fifth period transition metal or rare earth metal having atomic number or higher to 69 or lower is used, the Bi—O bond characteristics can be exhibited effectively. More preferably, Y, Eu, Gd, Tb, Dy, Ho, or Er is used. Due to the difference in the ion radius between the metal M and Bi, it is presumed that there is a strong tendency that $Bi^{3+}$ occupies the A site of perovskite and at least a part of $M^{3+}$ ions occupies the B site of perovskite. It is considered that, if suitable $MO_6$ octahedron is introduced into the structure of $BaTiO_3$, the covalency of Bi—O influences the structure of Ba—O effectively.

Thus, the ferroelectric ceramic material of the present invention can be expressed by the following basic structure:

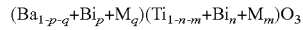

where $p+q=m+n=(a+b)/100$.

Further, if required, the ratio between b of $M_2O_3$ and a of $Bi_2O_3$ can be set to $b/a<1$. That is, $Bi^{3+}$ can enters the crystal lattice and occupies B site as well as the A site of perovskite. In this case, the ferroelectric ceramic material exhibits more stable ferroelectric characteristics.

Further, it is preferred that the particle size of these sintered bodies be small and uniform. More preferably, when the particle size of 90% or more of the particles is larger than 0.5 μm and equal to or smaller than 4 μm as a result of the observation with an electron microscope or an optical microscope, whereby the particles become dense, the mechanical strength becomes high, a leakage current flowing through the grain boundary is reduced, and an insulation resistance increases.

FIG. 1 is a schematic triangular phase diagram showing the range of $BaTiO_3$, $Bi_2O_3$, and $M_2O_3$ components in the ferroelectric ceramic material of the present invention. In the figure, BTO shows $BaTiO_3$. A shaded region is a composition region of an excellent ferroelectric in which the phase transition in the vicinity of a room temperature is suppressed or Tr is decreased to $-100°$ C. or lower, whereby Tr in the vicinity of a room temperature is removed.

In the region other than the shaded region, there is no ferroelectricity at a room temperature or Tr is present in a range of $-100°$ C. to $100°$ C.

The ferroelectric ceramic material of the present invention can be form such as a thin film and a bulk, depending upon the application. The ferroelectric ceramic material in a thin film can be obtained by forming a film on a substrate such as a silicon substrate, a zirconia substrate, or a glass substrate by a sol-gel method, sputtering, CVD, or aerosol deposition. After the film is formed, if required, the ferroelectric ceramic material is sintered in an atmosphere, preferably of 18 vol % or more of an oxygen concentration, whereby the insulation performance of the ferroelectric ceramic material can be enhanced, and the ferroelectric ceramic characteristics can be exhibited effectively.

The ferroelectric ceramic material in a bulk is produced using material powder by an ordinary production method of ceramics through calcination, molding, and calcination. The calcination can be conducted by mixing materials to be intended ferroelectric ceramic materials and allowing the mixture to react in a solid phase at $500°$ C. to $1,000°$ C. If required, a precursor of metal oxide powder to be a ferroelectric ceramic is obtained using alkali hydroxide, ammonia water, etc. from an aqueous solution of a nitrate, a sulfate, and an acetate, followed by calcination, whereby calcined powder can be obtained. Next, the step of granulating the calcined powder is performed so that the calcined powder can be formed to obtain a molded body. The granulation is conducted as follows: the calcined powder is dispersed in a dispersion of a binder such as polyvinyl alcohol, butyral (polyvinyl acetal), ethylcellulose, etc. to form a powder slurry, followed by a drying method such as spray drying, whereby granulated powder for molding is produced. In the molding step, a molded body in a desired shape is formed by a procedure such as a press method or a CIP method. Finally, the binder of the obtained molded body is decomposed at a temperature of $800°$ C. or lower, whereby calcination is performed.

In the case where the ferroelectric ceramic material has a laminated structure, green sheets are formed from a slurry of the calcined powder of the ferroelectric ceramic material by a doctor blade method, the green sheets are laminated in a desired layered structure by a forming method such as thermocompression or the like, a binder component is decomposed finally, and calcination is performed.

The ferroelectric ceramic material of the present invention is calcined at a temperature of preferably $1,000°$ C. or higher to $1,500°$ C. or lower. When the ferroelectric ceramic material of the present invention is calcined at a temperature of $1,000°$ C. or higher, $Bi^{3+}$ and $M^{3+}$ ions are diffused rapidly into a perovskite structure of $BaTiO_3$, and forms a solid solution in perovskite. Further, when the ferroelectric ceramic material is calcined at $1,500°$ C. or higher, the material is vitrified to be deformed, and a Bi component is volatilized from the surface, with the result that a desired calcined body cannot be obtained. More preferably, the ferroelectric ceramic material is calcined at a temperature of $1,200°$ C. or higher to $1,400°$ C. or lower. The ferroelectric ceramic material of the present invention contains an extremely small amount of a component in a glass state mainly containing bismuth oxide at a grain boundary and has its spontaneous polarization changed easily in a desired direction, and the original characteristics of a ferroelectric can be exhibited. In particular, in the case where the calcining temperature is lower than $1,000°$ C., $Bi_2O_3$ remains at the grain boundary of $BaTiO_3$, with the result that the ferroelectric characteristics may be impaired.

The ferroelectric ceramic material of the present invention can be used as a ferroelectric memory material by providing an electrode. Examples of the electrode material include Pt, Au, Ag, Cu, and Al. In the case of improving the adhesion, if required, an electrode material may be provided via Cr and Ti. In the case of a laminated structure, the ferroelectric ceramic material is produced by providing an electrode between layers.

In the case of using the ferroelectric ceramic material of the present invention as a piezoelectric material, the above-mentioned bulk is processed into a desired shape, and an electrode is provided in a predetermined portion. The electrode can be produced by forming a film of Pt, Au, Ag, Cu, or Al by sputtering or vapor deposition, or by printing Ag, Ni, or the like. In the case of using the ferroelectric ceramic material of the present invention as a piezoelectric element, the ferroelectric ceramic material can be used as various devices such as an ultrasonic transducer, a piezoelectric sensor, or an actuator.

Hereinafter, the present invention is described specifically by way of examples.

Example 1

Ferroelectric Ceramic Material Made of $92BaTiO_3 \cdot 8Bi_2O_3$ 15.26 g of $BaCO_3$, 6.18 g of $TiO_2$, and 5.00 g of $Bi_2O_3$ were mixed in an agate mortar for 30 minutes, and the mixture was calcined in an alumina pot at 750° C. for 5 hours. A Bi component was reduced in amount through the sintering process, therefore, $Bi_2O_3$ was prepared in a larger amount considering the decrease amount.

The mixture was crushed in the agate mortar for 1 hour, and the obtained powder was placed in an alumina pot and calcined at 900° C. for 5 hours. The obtained block was crushed in the agate mortar for 1 hour. The obtained powder was checked by X-ray diffraction, revealing that the powder became almost perovskite. The powder was set to be calcined powder 1.

10 g of the calcined powder 1 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 1.

1.3 g of the granulated powder 1 were placed in a die of 17 mmφ, and two pellets of the calcined powder 1 were formed by a 5-ton press machine. The pellets thus obtained were subjected to binder removal treatment by being calcined at 600° C. in air containing oxygen in a volume of 21%. Thereafter, the pellets were sintered at 1,250° C. for 3 hours. The pellets were crushed in the agate mortar, and the calcined powder was analyzed for a structure by X-ray diffraction. The obtained ferroelectric ceramic material had a lattice constant (short axis length) a of 0.3990 nm and a lattice constant (long axis length) c of 0.4040 nm in a tetragonal system. It was understood that Bi entered the lattice of a perovskite structure due to the extension of a c-axis. Further, the obtained sample was analyzed for a composition by an ICP analysis method (inductively coupled plasma), and as a result, it was found that the Bi component was reduced slightly by sintering, and a composition of about $92BaTiO_3 \cdot 8Bi_2O_3$ was obtained. When the cross-section was observed with an electron microscope, about 95% of the particles had a size of 1.2 μm.

The other obtained ferroelectric ceramic was polished by a polishing machine, and gold electrodes with a thickness of 500 nm were attached to both sides by sputtering. After that, the resultant ferroelectric ceramic was cut to obtain a measurement sample of 10 mm×2.5 mm×0.9 mm. The dielectric constant of the obtained sample was measured under the condition of a frequency of 1 kHz at an interval of 2° C. in a temperature range of −100° C. to 250° C. The sample exhibited a dielectric constant of 1,580 at a room temperature (25° C.) and the dielectric constant became maximum at 120° C. Therefore, it was found that the Curie temperature (Tc) was 120° C. The specific resistance was calculated by holding the sample at 10 V at a room temperature for 10 minutes by a DC method, and reading a resistance. The specific resistance was $1 \times 10^9 \Omega \cdot cm$. On the other hand, the peak of a dielectric constant as indicated by the phase transition in the vicinity of a room temperature was not seen. Further, the phase transition was not seen even in a range of −100° C. to 100° C. Table 1 shows the results.

Example 2

Ferroelectric Ceramic Material Made of $96.53BaTiO_3 \cdot 1.07Bi_2O_3 \cdot 2.4Y_2O_3$ 20.00 g of $BaCO_3$, 8.10 g of $TiO_2$, 0.81 g of $Bi_2O_3$, and 0.57 g of $Y_2O_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 950° C. for 5 hours. The block thus obtained was crushed in the agate mortar for 2 hours. The obtained powder was checked by X-ray diffraction, and it was found that the powder became almost perovskite. The powder was set to be calcined powder 2. Note that $Bi_2O_3$ of the material was prepared in a slightly larger amount in the same way as in Example 1, considering the decrease in amount of Bi during calcination.

10 g of the calcined powder 2 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 2.

1.3 g of the granulated powder 2 were placed in a die of 17 mmφ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,350° C. for 3 hours. The pellets were crushed in the agate mortar, and the calcined powder was analyzed for a structure by X-ray diffraction. The obtained ferroelectric ceramic material had a lattice constant (short axis length) a of 0.4009 nm and a lattice constant (long axis length) c of 0.4047 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was cut to obtain a measurement sample of 10 mm×2.5 mm×0.9 mm. The dielectric constant of the obtained sample was measured under the condition of a frequency of 1 kHz at an interval of 2° C. in a temperature range of −100° C. to 250° C. The sample exhibited a dielectric constant of 1,720 at a room temperature and a specific resistance of $2 \times 10^9 \Omega \cdot cm$, and the dielectric constant became maximum at 138° C. Therefore, it was found that the Curie temperature (Tc) was 138° C. On the other hand, the peak of a dielectric constant as indicated by the phase transition in the vicinity of a room temperature was not seen. Further, the peak of a dielectric constant indicating the phase transition was not observed even in a range of −100° C. to 100° C. Table 1 shows the results.

Example 3

Ferroelectric Ceramic Material Made of
96BaTiO$_3$.1.6Bi$_2$O$_3$.1.6Y$_2$O$_3$ 19.84 g of BaCO$_3$, 8.09 g of TiO$_2$, 1.20 g of Bi$_2$O$_3$, and 0.38 g of Y$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 950° C. for 5 hours. The block thus obtained was crushed in the agate mortar for 2 hours. The obtained powder was checked by X-ray diffraction, and it was found that the powder became almost perovskite. The powder was set to be calcined powder 3. Note that Bi$_2$O$_3$ of the material was prepared in a slightly larger amount in the same way as in Example 1, considering the decrease in amount of Bi during calcination.

10 g of the calcined powder 3 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 3.

1.3 g of the granulated powder 3 were placed in a die of 17 mmφ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,350° C. for 3 hours. The pellets were crushed in the agate mortar, and the calcined powder was analyzed for a structure by X-ray diffraction. The obtained ferroelectric ceramic material had a lattice constant (short axis length) a of 0.3999 nm and a lattice constant (long axis length) c of 0.4046 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.8 mm. The dielectric constant of the obtained sample was measured under the condition of a frequency of 1 kHz at an interval of 2° C. in a temperature range of −100° C. to 250° C. The sample exhibited a dielectric constant of 1,800 at a room temperature and a specific resistance of 1×10$^9$Ω·cm, and the dielectric constant became maximum at 140° C. Therefore, it was found that the Curie temperature (Tc) was 140° C. On the other hand, the peak of a dielectric constant as indicated by the phase transition in the vicinity of a room temperature was not seen. Further, the peak of a dielectric constant indicating the phase transition was not observed even in a range of −100° C. to 100° C. Table 1 shows the results.

Example 4

Ferroelectric Ceramic Material Made of
96.8BaTiO$_3$.1.6Bi$_2$O$_3$.1.6Eu$_2$O$_3$ 19.67 g of BaCO$_3$, 7.96 g of TiO$_2$, 1.20 g of Bi$_2$O$_3$, and 0.58 g of Eu$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 950° C. for 5 hours. The block thus obtained was crushed in the agate mortar for 2 hours. The obtained powder was checked by X-ray diffraction, and it was found that the powder became almost perovskite. The powder was set to be calcined powder 4. Note that Bi$_2$O$_3$ of the material was prepared in a slightly larger amount in the same way as in Example 1, considering the decrease in amount of Bi during calcination.

10 g of the calcined powder 4 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 4.

1.3 g of the granulated powder 4 were placed in a die of 17 mmφ, and two pellets of the calcined powder 2 were formed by a 5-ton press machine. The pellets thus obtained were subjected to binder removal treatment by being calcined at 600° C. in air containing oxygen in a volume of 21%. Thereafter, the pellets were sintered at 1,350° C. for 3 hours. The pellets were crushed in the agate mortar, and the calcined powder was analyzed for a structure by X-ray diffraction. The obtained ferroelectric ceramic material had a lattice constant (short axis length) a of 0.4004 nm and a lattice constant (long axis length) c of 0.4041 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.8 mm. The dielectric constant of the obtained sample was measured under the condition of a frequency of 1 kHz at an interval of 2° C. in a temperature range of −100° C. to 250° C. The sample exhibited a dielectric constant of 1,700 at a room temperature and the dielectric constant became maximum at 124° C. Therefore, it was found that the Curie temperature (Tc) was 124° C. The specific resistance was 6×10$^9$Ω·cm. The phase transition was not confirmed in a range of −100° C. to 100° C. Table 1 shows the results.

Example 5

Ferroelectric Ceramic Material Made of
96BaTiO$_3$.3.5Bi$_2$O$_3$.0.5Y$_2$O$_3$ 19.04 g of BaCO$_3$, 7.71 g of TiO$_2$, 2.42 g of Bi$_2$O$_3$, and 0.12 g of Y$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 850° C. for 5 hours. The block thus obtained was crushed in the agate mortar for 2 hours. The obtained powder was checked by X-ray diffraction, and it was found that the powder became almost perovskite. The powder was set to be calcined powder 5. Note that Bi$_2$O$_3$ of the material was prepared in a slightly larger amount in the same way as in Example 1, considering the decrease in amount of Bi during calcination.

10 g of the calcined powder 5 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 5.

1.3 g of the granulated powder 5 were placed in a die of 17 mmφ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,340° C. for 3 hours. One pellet was crushed in the agate mortar, and the calcined powder was analyzed for a structure by X-ray diffraction. The obtained ferroelectric ceramic material had a lattice constant (short axis length) a of 0.3999 nm and a lattice constant (long axis length) c of 0.4034 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.8 mm. The dielectric constant of the obtained sample was measured under the condition of a frequency of 1 kHz at an interval of 2° C. in a temperature range of −100° C. to 250° C. The sample exhibited a dielectric constant of 1,950 at a room temperature and a specific resistance of $5\times10^9 \Omega\cdot cm$, and the dielectric constant became maximum at 130° C. Therefore, it was found that the Curie temperature (Tc) was 130° C. On the other hand, the peak of a dielectric constant as indicated by the phase transition in the vicinity of a room temperature was not seen. Further, the peak of a dielectric constant indicating the phase transition was not observed even in a range of −100° C. to 100° C. Table 1 shows the results.

Example 6

Ferroelectric Ceramic Material Made of 95.5BaTiO$_3$.3.5Bi$_2$O$_3$.1In$_2$O$_3$ 18.91 g of BaCO$_3$, 7.65 g of TiO$_2$, 2.42 g of Bi$_2$O$_3$, and 0.28 g of In$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 850° C. for 5 hours. The block thus obtained was crushed in the agate mortar for 2 hours. The obtained powder was checked by X-ray diffraction, and it was found that the powder became almost perovskite. The powder was set to be calcined powder 6. Note that Bi$_2$O$_3$ of the material was prepared in a slightly larger amount in the same way as in Example 1, considering the decrease in amount of Bi during calcination.

10 g of the calcined powder 6 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 6.

1.3 g of the granulated powder 6 were placed in a die of 17 mmφ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,320° C. for 3 hours. One pellet was crushed in the agate mortar, and the calcined powder was analyzed for a structure by X-ray diffraction. The obtained ferroelectric ceramic material had a lattice constant (short axis length) a of 0.3991 nm and a lattice constant (long axis length) c of 0.4045 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.6 mm. The dielectric constant of the obtained sample was measured under the condition of a frequency of 1 kHz at an interval of 2° C. in a temperature range of −100° C. to 250° C. The sample exhibited a dielectric constant of 1,850 at a room temperature and a specific resistance of $2\times10^9 \Omega\cdot cm$, and the dielectric constant became maximum at 142° C. Therefore, it was found that the Curie temperature (Tc) was 142° C. The phase transition was not confirmed in a range of −100° C. to 100° C. Table 1 shows the results.

Example 7

Ferroelectric Ceramic Material Made of 94.7BaTiO$_3$.1.3Bi$_2$O$_3$.4Y$_2$O$_3$ 15.61 g of BaCO$_3$, 6.32 g of TiO$_2$, 0.81 g of Bi$_2$O$_3$, and 0.76 g of Y$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 900° C. for 5 hours. The block thus obtained was crushed in the agate mortar for 1 hour. The obtained powder was checked by X-ray diffraction, and it was found that the powder became almost perovskite. The powder was set to be calcined powder 7. Note that Bi$_2$O$_3$ of the material was prepared in a slightly larger amount in the same way as in Example 1, considering the decrease in amount of Bi during calcination.

10 g of the calcined powder 7 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder 7.

1.3 g of the granulated powder 7 were placed in a die of 17 mmφ, and two pellets of the calcined powder 1 were formed by a 5-ton press machine. The pellets thus obtained were subjected to binder removal treatment by being calcined at 600° C. in air containing oxygen in a volume of 21%. Thereafter, the pellets were sintered at 1,350° C. for 3 hours. The pellets were crushed in the agate mortar, and the calcined powder was analyzed for a structure by X-ray diffraction. The obtained ferroelectric ceramic material had a lattice constant (short axis length) a of 0.4000 nm and a lattice constant (long axis length) c of 0.4030 nm in a tetragonal system. It was understood from the above that Bi and Y entered the lattice of a perovskite structure.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.9 mm. The dielectric constant of the obtained sample was measured under the condition of a frequency of 1 kHz at an interval of 2° C. in a temperature range of −100° C. to 250° C. The sample exhibited a dielectric constant of 900 at a room temperature and the dielectric constant became maximum at 120° C. Therefore, it was found that the Curie temperature (Tc) was 120° C. The specific resistance was $4 \times 10^9 \Omega \cdot cm$. On the other hand, the peak of a dielectric constant as indicated by the phase transition in the vicinity of a room temperature was not seen. Further, the peak of a dielectric constant indicating the phase transition was not observed even in a range of −100° C. to 100° C. Table 1 shows the results.

Example 8

Ferroelectric Ceramic Material Made of 97.075BaTiO$_3$.1.3Bi$_2$O$_3$.1.625Y$_2$O$_3$ 156.28 g of BaCO$_3$, 63.25 g of TiO$_2$, 7.48 g of Bi$_2$O$_3$, and 3.01 g of Y$_2$O$_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 900° C. for 5 hours. The block thus obtained was crushed in a Zirconia ball mill of 5 map for 10 hours. The obtained powder was checked by X-ray diffraction, and it was found that the powder became almost perovskite. The powder was set to be calcined powder 8. Note that Bi$_2$O$_3$ of the material was prepared in a slightly larger amount in the same way as in Example 1, considering the decrease in amount of Bi during calcination.

200 g of the calcined powder 8 were placed in 132 g of a 4.5% polyvinyl alcohol solution to produce a slurry, and the slurry was dried by cyclone-type spray drying and granulated. The powder thus obtained was set to be granulated powder 8.

1.3 g of the granulated powder 8 were placed in a die of 17 mmϕ, and two pellets of the calcined powder 1 were formed by a 5-ton press machine. The pellets thus obtained were subjected to binder removal treatment by being calcined at 600° C. in air containing oxygen in a volume of 21%. Thereafter, the pellets were sintered at 1,350° C. for 3 hours. The pellets were crushed in the agate mortar, and the calcined powder was analyzed for a structure by X-ray diffraction. The obtained ferroelectric ceramic material had a lattice constant (short axis length) a of 0.4000 nm and a lattice constant (long axis length) c of 0.4030 nm in a tetragonal system. It was understood from the above that Bi and Y entered the lattice of a perovskite structure. Further, the cross-section of the bulk was observed with an electron microscope to reveal that a particle size was uniform, i.e., 2 μm or more to 3 μm or less.

Figure 2:
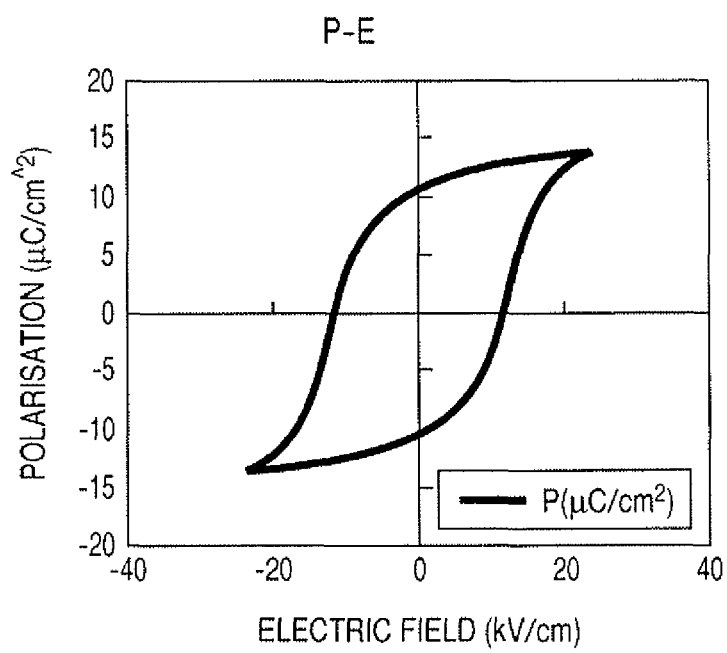
FIG. 2 illustrates a polarization-electric field (P-E) hysteresis curve (frequency: 1 Hz, voltage: 1 kV) according to Example 8.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.427 mm. The dielectric constant of the obtained sample was measured under the condition of a frequency of 1 kHz at an interval of 2° C. in a temperature range of −100° C. to 250° C. The sample exhibited a dielectric constant of 967 at a room temperature and the dielectric constant became maximum at 134° C. Therefore, it was found that the Curie temperature (Tc) was 134° C. The specific resistance was $3 \times 10^9 \Omega \cdot cm$, and hence, the insulation property was high. The particle size was small, i.e., 2 μm or more to 3 μm or less, and further, the particles were produced uniformly, therefore, the particles became dense, and a leakage current flowing through the grain boundary was considered to be suppressed. On the other hand, the peak indicating phase transition temperature (Tr) in the vicinity of a room temperature was not seen. Further, the peak of a dielectric constant, which was considered as phase transition, was not observed even in a range of −100° C. to 100° C. Table 1 shows the results. Further, the polarization-electric field (P-E) hysteresis was measured at a frequency of 1 Hz and a voltage of 1 kV, and as a result, a residual dielectric polarization Pr was 12 μC/cm$^2$ (FIG. 2). Further, the sample was subjected to polarization treatment by being supplied with a DC voltage of 1 kV for 30 minutes in an environment at 100° C., and thereafter, the piezoelectric performance was measured by a resonance/anti-resonance method. A piezoelectric constant d31 was 34.9 μm/V, and the modulus of elasticity in a polarization direction was 131 GPa. On the other hand, before the polarization, an electric signal caused by mechanical vibration was not observed. From the above, it was found that the anisotropy of the spontaneous polarization of the present material is kept after the polarization, and has performance as a piezoelectric material.

Comparative Example 1

Ferroelectric Ceramic Material Made of BaTiO$_3$(a=0, b=0)

21.15 g of BaCO$_3$ and 8.56 g of TiO$_2$ were mixed in the agate mortar for 30 minutes, and the mixture was calcined in an alumina pot at 850° C. for 5 hours. The mixture was crushed in the agate mortar for 1 hour, and the obtained powder was placed in the alumina pot and calcined at 850° C. for 5 hours. The block thus obtained was crushed in the agate mortar for 2 hours. The obtained powder was checked by X-ray diffraction, and it was found that the powder became almost perovskite. The powder was set to be calcined powder C1.

10 g of the calcined powder C1 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder C1.

1.3 g of the granulated powder C1 were placed in a die of 17 mmϕ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,280° C. for 3 hours. One pellet was crushed in the agate mortar, and the calcined powder was analyzed for a structure by X-ray diffraction. The obtained ferroelectric ceramic material had a lattice constant a of 0.3997 nm and a lattice constant c of 0.4030 nm in a tetragonal system.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.8 mm. The dielectric constant of the obtained sample was measured under the condition of a frequency of 1 kHz at an interval of 2° C. in a temperature range of −100° C. to 250° C. The sample exhibited a dielectric constant of 3,000 at a room temperature and the specific resistance was $2 \times 10^9 \Omega \cdot cm$. The dielectric constant became maximum at 122° C. Therefore, it was found that the Curie temperature (Tc) was 122° C. The dielectric constant increased even in the vicinity of 6° C., and the presence of the transition in the vicinity of a room temperature was confirmed. Table 1 shows the results.

Comparative Example 2

Ferroelectric Ceramic Material Made of $87.5BaTiO_3 \cdot 5Bi_2O_3 \cdot 7.5Y_2O_3$ (a=5, b=7.5, a+3b=27.5)

16.77 g of $BaCO_3$, 6.79 g of $TiO_2$, 3.49 g of $Bi_2O_3$, and 1.69 g of $Y_2O_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 800° C. for 5 hours. The block thus obtained was crushed in the agate mortar for 2 hours. The obtained powder was checked by X-ray diffraction, and it was found that the powder became almost perovskite. The powder was set to be calcined powder C2. Note that $Bi_2O_3$ of the material was prepared in a slightly larger amount in the same way as in Example 1, considering the decrease in amount of Bi during calcination.

10 g of the calcined powder C2 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder C2.

1.3 g of the granulated powder C2 were placed in a die of 17 mmφ, and two pellets of the calcined powder 2 were formed by a 5-ton press machine. The pellets thus obtained were subjected to binder removal treatment by being calcined at 600° C. under and atmosphere containing oxygen in a volume of 20% and nitrogen in a volume of 80%. Thereafter, the pellets were sintered at 1,250° C. for 3 hours. The pellets were crushed in the agate mortar, and the calcined powder was analyzed for a structure by X-ray diffraction. The obtained ferroelectric ceramic material had a lattice constant a of 0.4052 nm in a cubic system.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.75 mm. The dielectric constant of the obtained sample was measured under the condition of a frequency of 1 kHz at an interval of 2° C. in a temperature range of −100° C. to 250° C. The sample exhibited a dielectric constant of 1,620 at a room temperature. However, the presence of the Curie temperature (Tc) in the temperature range of a room temperature or higher was not confirmed. Table 1 shows the results.

Comparative Example 3

Ferroelectric Ceramic Material Made of $84BaTiO_3 \cdot 16Bi_2O_3$ 13.1 g of $BaCO_3$, 5.3 g of $TiO_2$, and 11.6 g of $Bi_2O_3$ were mixed in the agate mortar for 30 minutes, and the mixture was calcined in an alumina pot at 750° C. for 5 hours. The mixture was crushed in the agate mortar for 1 hour, and the obtained powder was placed in the alumina pot and calcined at 800° C. for 5 hours. The block thus obtained was crushed in the agate mortar for 2 hours. The obtained powder was checked by X-ray diffraction, and it was found that the powder became almost perovskite. The powder was set to be calcined powder C3. Note that $Bi_2O_3$ of the material was prepared in a slightly larger amount in the same way as in Example 1, considering the decrease in amount of Bi during calcination.

10 g of the calcined powder C3 were placed in 6.6 g of an ethanol solution of 4.5% butyral and stirred in a planetary ball mill for 5 minutes. After that, alcohol was evaporated from the mixture at 70° C. The block thus obtained was crushed in the agate mortar and powder was obtained through a 250 μm sieve. The obtained powder was set to be granulated powder C3.

1.3 g of the granulated powder C3 were placed in a die of 17 mmφ, and two pellets of the calcined powder 2 were formed by a 5-ton press machine. The pellets thus obtained were subjected to binder removal treatment by being calcined at 600° C. under an atmosphere containing oxygen in a volume of 20% and nitrogen in a volume of 80%. Thereafter, the pellets were sintered at 1,250° C. for 3 hours. The pellets were crushed in the agate mortar, and the calcined powder was analyzed for a structure by X-ray diffraction. The obtained ferroelectric ceramic material had a lattice constant a of 0.3990 nm and a lattice constant c of 0.4030 nm in a tetragonal system.

The other obtained ferroelectric ceramic was polished by a polishing machine, and gold electrodes with a thickness of 500 nm were attached to both sides by sputtering. After that, the resultant ferroelectric ceramic was further cut to obtain a measurement sample of 10 mm×2.5 mm×0.427 mm. The dielectric constant of the obtained sample was measured under the condition of a frequency of 1 kHz at an interval of 2° C. in a temperature range of −100° C. to 250° C. The sample exhibited a dielectric constant of 1,700 at a room temperature and the dielectric constant became maximum at 110° C. Therefore, it was found that the Curie temperature (Tc) was 110° C. The specific resistance was $3 \times 10^8 \Omega \cdot cm$, and hence, the insulation performance was low. The particle size was 2 μm or more to 20 μm or less. On the other hand, the dielectric constant was measured under the condition of a frequency of 1 kHz at an interval of 2° C. in a temperature range of −100° C. to 250° C., and as a result, the peak indicating phase transition in the vicinity of a room temperature was not seen. Further, the peak of a dielectric constant, which was considered as phase transition, was not seen even in a range of −100° C. to 100° C. Table 1 shows the results.

Further, as the other composition, $98.8BaTiO_3 \cdot 0.2Bi_2O_3 \cdot 1Y_2O_3$, $97.5BaTiO_3 \cdot 0.5Bi_2O_3 \cdot 2.0Y_2O_3$, $97.5BaTiO_3 \cdot 0.5Bi_2O_3 \cdot 2.0Y_2O_3$ were produced, and the dielectric constant was measured. As a result, it was confirmed in all of the samples that the conventional dielectric constant derived from the transition in the vicinity of a room temperature increased in a temperature range of −100° C. to 50° C.

TABLE 1

| | Bi a | M b | Value of a + 3b | Presence/absence of Tr | Curie temperature Tc (° C.) | Specific dielectric constant (room temperature 1 kHz) | Specific resistance (Ω · cm) |
|---|---|---|---|---|---|---|---|
| Example 1 | 8 | 0 | 8 | None | 120 | 1,580 | $1 \times 10^9$ |
| Example 2 | 1.07 | 2.4 | 8.3 | None | 138 | 1,720 | $3 \times 10^9$ |
| Example 3 | 1.6 | 1.6 | 6.4 | None | 140 | 1,800 | $2 \times 10^9$ |
| Example 4 | 1.6 | 1.6 | 6.4 | None | 124 | 1,700 | $6 \times 10^9$ |
| Example 5 | 3.5 | 0.5 | 5.0 | None | 130 | 1,950 | $5 \times 10^9$ |
| Example 6 | 3.5 | 1 | 6.5 | None | 142 | 1,850 | $2 \times 10^9$ |
| Example 7 | 1.3 | 4 | 13.3 | None | 120 | 900 | $4 \times 10^9$ |
| Example 8 | 1.3 | 1.625 | 6.2 | None | 134 | 957 | $3 \times 10^9$ |
| Comparative Example 1 | 0 | 0 | 0 | Present (6° C.) | 122 | 3,000 | $2 \times 10^9$ |
| Comparative Example 2 | 5 | 7.5 | 27.5 | None | — No ferroelectricity | 1,620 | $3 \times 10^7$ |
| Comparative Example 3 | 16 | 0 | 16 | None | 110 | 1,700 | $3 \times 10^8$ |

The ferroelectric ceramic material of the present invention contains no lead, can control a Curie temperature in a wide range, has no phase transition in the vicinity of a room temperature, and exhibits excellent ferroelectric characteristics. Therefore, the ferroelectric ceramic material of the present invention can be used as a piezoelectric material, a ferroelectric memory, and the like with a low burden on the environment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-255081, filed Sep. 30, 2008, No. 2009-209542, filed Sep. 10, 2009, which are hereby incorporated by reference herein in their entirety.

What is claimed is:

1. A ferroelectric ceramic material comprising an oxide represented by the following formula:

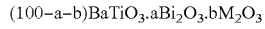

(100−a−b)BaTiO$_3$.aBi$_2$O$_3$.bM$_2$O$_3$ where M represents a trivalent metal other than Bi, and a and b satisfy $1 \leq a \leq 15$, $0.5 \leq b \leq 2.4$, and $5 \leq a+3b \leq 15$.

2. The ferroelectric ceramic material according to claim 1, wherein a satisfies $1.07 \leq a \leq 3.5$.

3. The ferroelectric ceramic material according to claim 1, wherein b satisfies $1 \leq b \leq 2.4$.

4. The ferroelectric ceramic material according to claim 1, wherein M is a trivalent metal selected from fifth period transition metals in a periodic table or rare earth metals having an atomic number of 59 or higher to 69 or lower.

5. The ferroelectric ceramic material according to claim 4, wherein M is a trivalent metal selected from Y, Eu, or In.

6. The ferroelectric ceramic material according to claim 5, wherein M is Y.

7. The ferroelectric ceramic material according to claim 1, wherein a ratio between b and a is b/a<1.

8. A method of producing the ferroelectric ceramic material according to claim 1, comprising:
    calcining the oxide in an atmosphere of 18 vol % or more of an oxygen concentration.

9. A method of producing the ferroelectric ceramic material according to claim 1, comprising:
    calcining the oxide at 1,000° C. or higher to 1,500° C. or lower.

10. The method according to claim 9, wherein the oxide is calcined at 1,200° C. or higher to 1,400° C. or lower.

* * * * *